(12) United States Patent
Lam

(10) Patent No.: US 10,937,509 B1
(45) Date of Patent: Mar. 2, 2021

(54) VOLTAGE AND TEMPERATURE ADAPTIVE MEMORY LEAKAGE REDUCTION BIAS CIRCUIT

(71) Applicant: Mentor Graphics Corporation, Wilsonville, OR (US)

(72) Inventor: Kwan Him Lam, Irvine, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/553,890

(22) Filed: Aug. 28, 2019

(51) Int. Cl.
| G11C 16/30 | (2006.01) |
| G11C 29/02 | (2006.01) |
| G11C 11/41 | (2006.01) |
| G11C 5/14  | (2006.01) |
| G11C 29/50 | (2006.01) |

(52) U.S. Cl.
CPC .............. *G11C 16/30* (2013.01); *G11C 5/148* (2013.01); *G11C 11/41* (2013.01); *G11C 29/021* (2013.01); *G11C 2029/5006* (2013.01)

(58) Field of Classification Search
CPC ...... G11C 16/30; G11C 7/04; G11C 11/40626
See application file for complete search history.

(56) References Cited

U.S. PATENT DOCUMENTS

| 7,271,615 B2 | 9/2007 | Morteza et al. |
| 9,640,242 B1* | 5/2017 | Lo .......................... G06F 1/3275 |
| 2005/0185491 A1* | 8/2005 | Kim .................. G11C 11/40626 365/222 |
| 2012/0170360 A1* | 7/2012 | Yoon .................... G11C 7/1096 365/163 |

\* cited by examiner

*Primary Examiner* — Han Yang

(57) ABSTRACT

This application discloses a memory device to retain stored data when receiving a voltage supply having at least a retention voltage level. The retention voltage level varies based on a supply voltage and a temperature of an environment around the memory device. A sensitive circuit can adjust the voltage supply received by the memory device based on the supply voltage and the temperature. The sensitive circuit can alter a memory bias supply voltage for the memory device to adjust the voltage supply towards the retention voltage level. The sensitive circuit can include a temperature dependent circuit to generate a bias voltage based on the supply voltage and the temperature, and an adjustment circuit to alter the memory bias supply voltage based on the bias voltage. The adjustment circuit also can include high temperature circuitry to adjust the memory bias supply voltage based on a leakage current from the memory device.

19 Claims, 4 Drawing Sheets

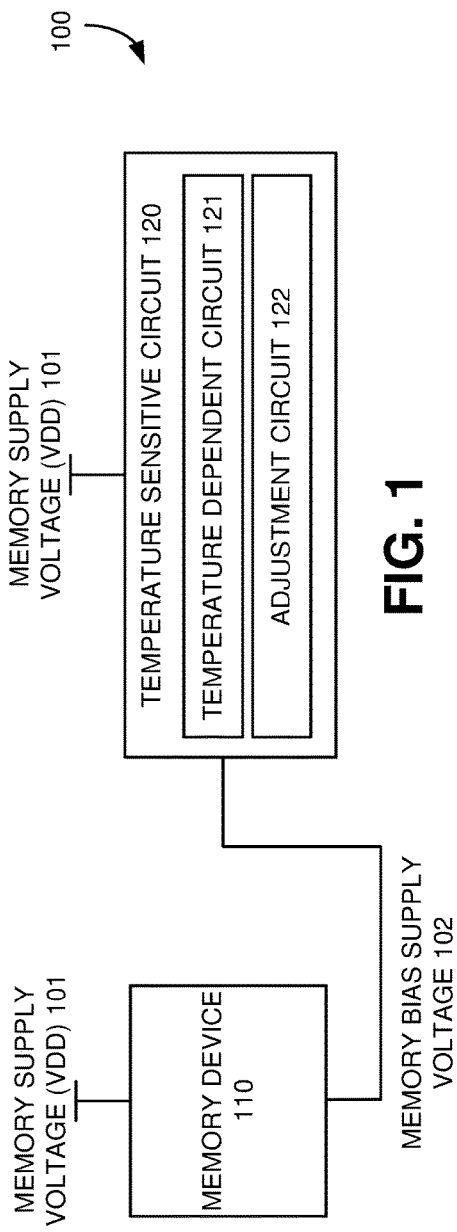
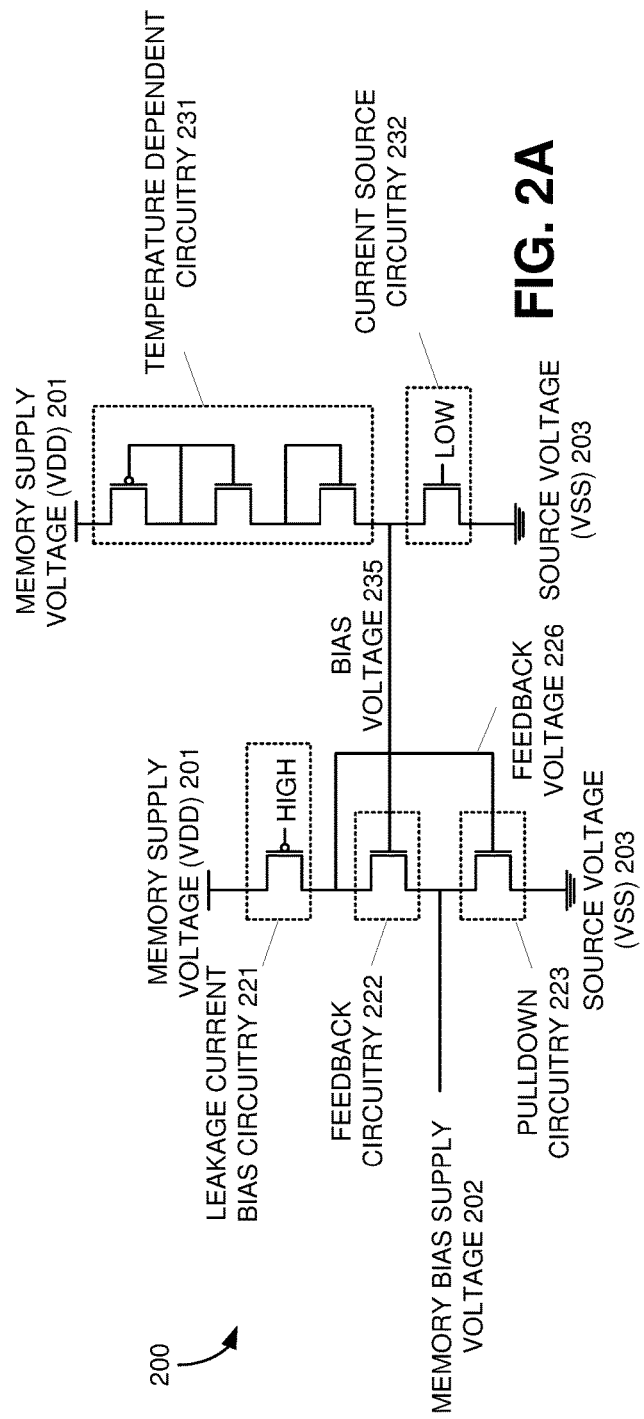
FIG. 1
FIG. 2A

COLD TEMPERATURE ENVIRONMENT

HOT TEMPERATURE ENVIRONMENT

VOLTAGE AND TEMPERATURE ADAPTIVE MEMORY LEAKAGE REDUCTION BIAS CIRCUIT

TECHNICAL FIELD

This application is generally related to integrated circuits and, more specifically, to voltage and temperature adaptive memory leakage reduction bias current.

BACKGROUND

Integrated circuits, such as memory devices, dissipate power due to device leakage. When products including the integrated circuits are powered by batteries, such as mobile devices, the power dissipation due to device leakage reduces battery life.

A magnitude of the device leakage and thus the power dissipation can correspond to a voltage supply provided to the integrated circuits. Since memory devices can have an active mode, for example, when performing read operations or write operations, which consumes more power than an inactive mode, for example, retaining stored data, many electronic devices incorporating the memory devices can lower the voltage supply provided to the memory devices during the inactive mode. Many electronic devices lower the voltage supply to a fixed voltage level at or above a retention voltage level of the memory devices. The retention voltage level can correspond to a minimum supply voltage that allows the memory devices to retain stored data without data corruption due to inadequate voltage supply.

Since the retention voltage level of the memory devices can vary based on a temperature in an environment around the memory devices, the fixed voltage level of the voltage supply in the inactive mode may be higher than retention voltage level leading to excessive current leakage and power dissipation. Some electronic devices incorporating the memory devices can attempt to adjust the power supply according to temperature changes by incorporating a voltage regulator with temperature sensor. The voltage regulator and temperature sensor, however, consume die area and power to perform the power supply adjustment, which reduces or eliminates the potential power consumption savings by varying the voltage supply to the memory devices. Environmental temperature also can often be non-uniform across an integrated circuit, memory devices, or electronic devices, leading designers of the electronic devices to incorporate multiple voltage regulators and multiple temperature sensors to adjust the power supply based on local temperature variations.

SUMMARY

This application discloses a memory device configured to retain stored data when receiving a voltage supply having at least a retention voltage level. The retention voltage level for the memory device can correspond to a minimum level of voltage the memory device can receive and still retain the stored data. The retention voltage level can vary based on a temperature of an environment around the memory device. As the temperature changes in the environment around the memory device, the retention voltage level of the memory device also changes.

A temperature sensitive circuit can adjust the voltage supply received by the memory device to correspond to the retention voltage based on a supply voltage provided to the memory device and the temperature of the environment. The temperature sensitive circuit can alter a memory bias supply voltage for the memory device to adjust the retention voltage level of the voltage supply. The temperature sensitive circuit can include a temperature dependent circuit to generate a bias voltage based on the supply voltage provided to the memory device and the temperature of the environment, and an adjustment circuit to alter the memory bias supply voltage based on the bias voltage. The adjustment circuit also can include high temperature circuitry to adjust the memory bias supply voltage based on a leakage current from the memory device. Embodiments will be described in greater detail below.

DESCRIPTION OF THE DRAWINGS

FIG. 1 illustrates an example memory system having temperature sensitive circuitry according to embodiments.

FIG. 2A illustrates an example of temperature sensitive circuitry used to control a voltage supply for a memory system according to embodiments.

DETAILED DESCRIPTION

Figure 2B:
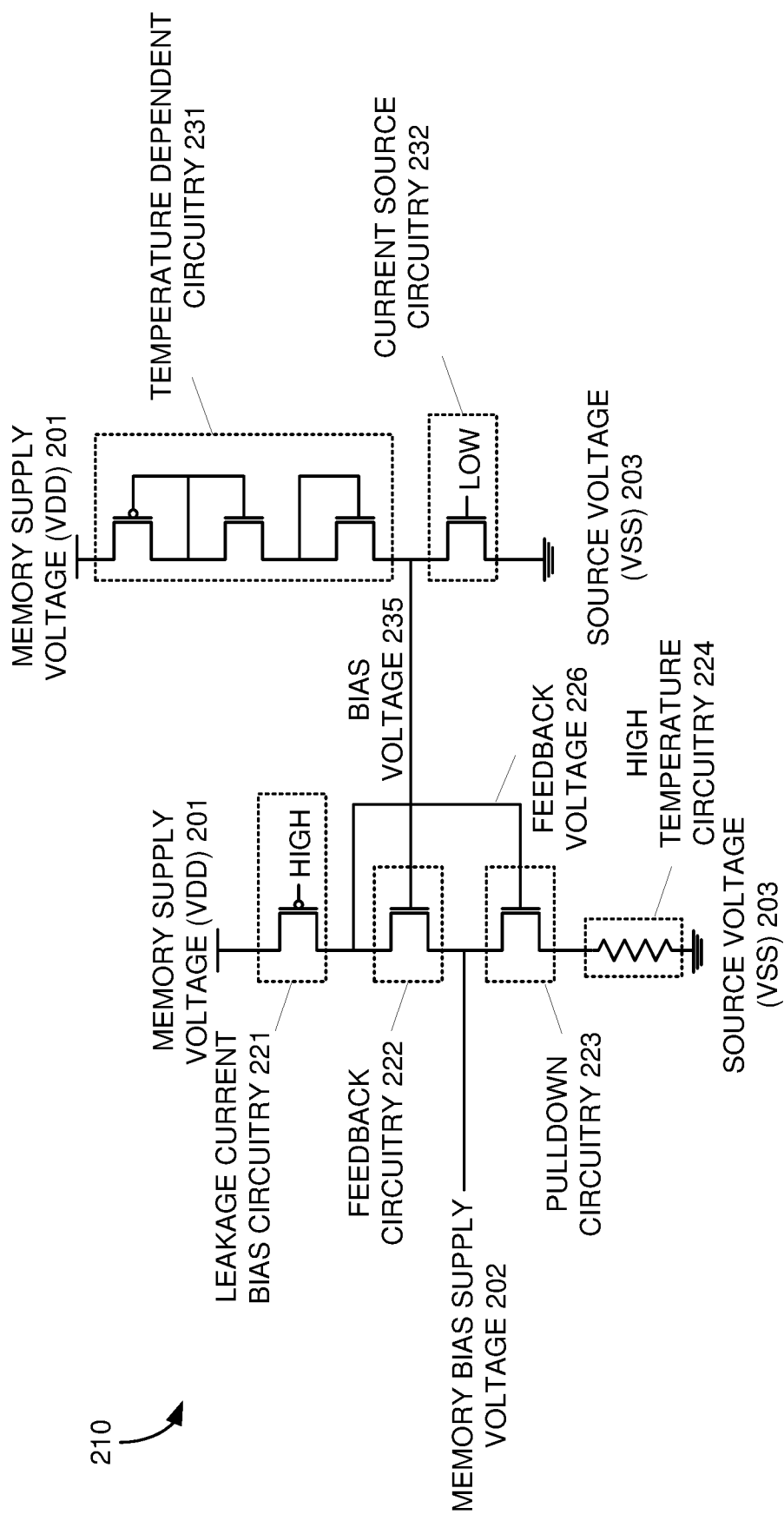
FIG. 2B illustrates another example of temperature sensitive circuitry used to control a voltage supply for a memory system according to embodiments.

Memory System with Adaptive Voltage and Temperature Supply Control

FIG. 1 illustrates an example memory system 100 having temperature sensitive circuit 120 according to embodiments. Referring to FIG. 1, a memory system 100 can include a memory device 110 having one or more memory cells configured to store data. In some embodiments, the memory device 110 can be a Static Random Access Memory (SRAM) device, Dynamic Random Access Memory (DRAM) device, or the like, which utilizes a voltage supply to perform memory access operations, such reading or writing data to the memory cells, and to retain stored data in the memory cells. The voltage supply can correspond to a difference between a memory supply voltage (VDD) 101 and a memory bias supply voltage 102.

The memory device 110 can perform the memory access operations in an active mode using a voltage supply that is higher than when the memory device is retaining stored data in an inactive mode. The memory device 110 can operate in the inactive mode to retain stored data when provided a voltage supply having at least a retention voltage level. The retention voltage level can correspond to a voltage level capable of allowing the memory device 110 to continue to store the data without corruption due to a lack of an adequate supply voltage.

Since the voltage level of the voltage supply can correlate to a magnitude of a leakage current exiting the memory device 110, which corresponds to power consumption by the memory device 110, the memory system 100 can reduce the voltage supply to the memory device 110 towards the retention voltage level when retaining the stored data as opposed to performing memory access operations.

The retention voltage level for the memory device 110 can vary based on an environmental temperature, for example, the retention voltage level can become lower when the temperature of the environment increases. The memory system 100 can include a temperature sensitive circuit 120 to adjust the voltage supply to the memory device 110 based on the temperature of the environment. In some embodiments, the temperature sensitive circuit 120 can alter the memory bias supply voltage 102 based on the temperature of the environment, which can adjust the voltage supply to the memory device 110.

The temperature sensitive circuit 120 can include a temperature dependent circuit 121 to generate a bias voltage based on the memory supply voltage (VDD) 101 and the temperature of the environment. In some embodiments, the temperature dependent circuit 121 can detect a voltage level of the memory supply voltage (VDD) 101 and the temperature of the environment, and generate a bias voltage from the memory supply voltage (VDD) 101 and the detected temperature of the environment to generate the bias voltage. For example, when the environment corresponds to a colder temperature, the temperature dependent circuit 121 can reduce the bias voltage towards zero. When the environment corresponds to a warmer temperature, the temperature dependent circuit 121 can increase the bias voltage relative to the voltage level associated with the environment having the colder temperature.

The temperature sensitive circuit 120 can include an adjustment circuit 122 to receive the bias voltage from the temperature dependent circuit 121 and alter the memory bias supply voltage 102 based on the bias voltage. For example, when the bias voltage from the temperature dependent circuit 121 corresponds to a lower voltage level, the adjustment circuit 122 can utilize the bias voltage to reduce the memory bias supply voltage 102, which increases the voltage supply across the memory device 110. When the bias voltage from the temperature dependent circuit 121 corresponds to a higher voltage level, the adjustment circuit 122 can utilize the bias voltage to increase the memory bias supply voltage 102, which reduces the voltage supply for the memory device 110. These increases and reductions of the voltage supply by the temperature sensitive circuit 120 can correspond to the variations in the retention voltage level due to changes in the temperature of the environment. Embodiments of adaptive voltage control with temperature sensitive circuitry will be described below in greater detail.

In some embodiments, the temperature sensitive circuit 120 can utilize the temperature dependent circuit 121 and the adjustment circuit 122 to compensate for variations in the memory supply voltage (VDD) 101. Since changes in the memory supply voltage (VDD) 101 could alter the voltage supply to the memory device 110, the temperature sensitive circuit 120 can adjust the memory bias supply voltage 102 based on changes to the memory supply voltage (VDD) 101 to at least in part avoid variations of the voltage supply to the memory device 110 due to the changes to the memory supply voltage (VDD) 101.

Adaptive Voltage Control with Temperature Sensitive Circuitry

FIG. 2A illustrates an example of temperature sensitive circuitry 200 used to control a voltage supply for a memory system according to embodiments. Referring to FIG. 2A, the temperature sensitive circuitry 200 can include temperature dependent circuitry 231 to generate a bias voltage 235 based on a memory supply voltage (VDD) 201 and a temperature of an environment around the memory system. For example, when the environment has a colder temperature or a lower voltage level for the memory supply voltage (VDD) 201, the temperature dependent circuitry 231 can generate the bias voltage 235 with a lower voltage level than when the environment has a warmer temperature or a higher voltage level for memory supply voltage (VDD) 201.

In some embodiments, the temperature dependent circuitry 231 can include one or more diode circuits to control the bias voltage 235. For example, the temperature dependent circuitry 231 can include a diode-connected P-type metal-oxide-semiconductor (PMOS) transistor coupled to in series with the memory supply voltage (VDD) 201 and a series-connected pair of diode-connected N-type metal-oxide-semiconductor (NMOS) transistors. The number of diode circuits and the types of diode circuits utilized as the temperature dependent circuitry 231 can be based on a magnitude of the voltage drop from the memory supply voltage (VDD) 201 to the bias voltage 235, the threshold voltages for the diode circuits, the temperature sensitivity of the diode circuits, or the like.

The temperature sensitive circuitry 200 can include current source circuitry 232 coupled between the temperature dependent circuitry 231 and a source voltage VSS 203. The current source circuitry 232 can have a high impedance, which can induce a small amount of current relative to the voltage drop across the current source circuitry 232. By inducing a small amount of current relative to the voltage drop across the current source circuitry 232, the current source circuitry 232 can allow the circuitry in the temperature dependent circuitry 231 to dictate the voltage level of the bias voltage 235. In some embodiments, the current source circuitry 232 can be an N-type metal-oxide-semiconductor (NMOS) transistor having a low voltage on a gate, which can place the NMOS transistor in an "off" state with a small amount of current flowing due to the difference in voltage between the bias voltage 235 and the source voltage (VSS) 203.

The temperature sensitive circuitry 200 can include leakage current bias circuitry 221, feedback circuitry 222, and pulldown circuitry 223 that can work in combination to adjust the memory bias supply voltage 202 based on a voltage level of the bias voltage 235. The leakage current bias circuitry 221 can be coupled between the memory supply voltage (VDD) 201 and the feedback circuitry 222. In some embodiments, the leakage current bias circuitry 221 can have a high impedance, which can induce a small amount of current relative to the voltage drop across the leakage current bias circuitry 221. By inducing a small amount of current relative to the voltage drop across the leakage current bias circuitry 221, the leakage current bias circuitry 221 can allow the feedback circuitry 222 to dictate the voltage level of the feedback voltage 226. In some embodiments, the leakage current bias circuitry 221 can be a P-type metal-oxide-semiconductor (PMOS) transistor having a high voltage on a gate, which can place the PMOS transistor in an "off" state with current flowing due to the difference in voltage between the memory supply voltage (VDD) 201 and the feedback voltage 226.

The feedback circuitry 222 can be coupled between the leakage current bias circuitry 221 and the pulldown circuitry 223. The feedback circuitry 222 can receive the bias voltage 235 from the temperature sensitive circuitry 231 and set a feedback voltage 226 to a voltage level based, at least in part, on a voltage level of the bias voltage 235. In some embodiments, the feedback circuitry 222 can be an N-type metal-oxide-semiconductor (NMOS) transistor, which can be in an "off" state when the bias voltage 235 has a low voltage level and in an "on" state when the bias voltage 235 has a high voltage level.

The pulldown circuitry 223 can be coupled between the feedback circuitry 222. And the source voltage (VSS) 203.

The pulldown circuitry 223 can adaptively adjust the memory bias supply voltage 202 based on the feedback voltage 226, for example, reducing the memory bias supply voltage 202 by a magnitude based on a voltage level of the feedback voltage 226. In some embodiments, the pulldown circuitry 223 can be an N-type metal-oxide-semiconductor (NMOS) transistor that receives the feedback voltage 226 at its gate. Embodiments of the operation of temperature sensitive voltage adaptive circuitry will be described below in greater detail.

FIG. 2B illustrates another example of temperature sensitive circuitry 210 used to control a voltage supply for a memory system according to embodiments. Referring to FIG. 2B, a temperature sensitive circuitry 210 can be similar to the temperature sensitive circuitry 200 described above with reference to FIG. 2A with the addition of high temperature circuitry 224 coupled between the pulldown circuitry 223 and the source voltage (VSS) 203. The high temperature circuitry 224, in a warmer or hot temperature environment, can induce a current to raise a voltage level of the memory bias supply voltage 202 and the feedback voltage 226 compared to the voltage level of the memory bias supply voltage 202 set by temperature sensitive circuitry 200 in the same environment. This increase in the memory bias supply voltage 202 can reduce the voltage supply to the memory device. Embodiments of the operation of temperature sensitive voltage adaptive circuitry with the high temperature circuitry will be described below in greater detail.

Figure 3:
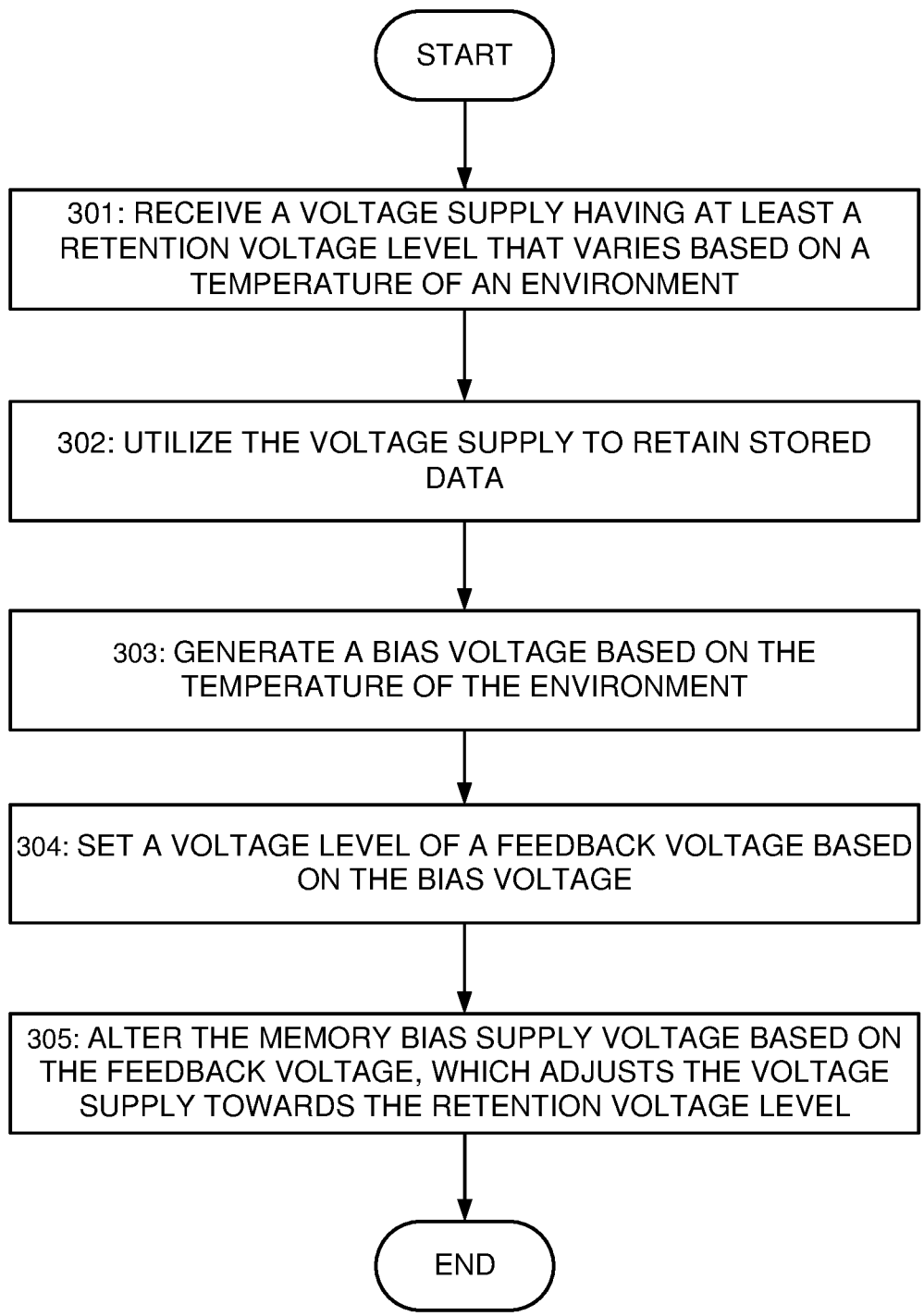
FIG. 3 illustrates an example flowchart to control a voltage supply for a memory system with temperature sensitive circuitry according to embodiments.

FIG. 3 illustrates an example flowchart to control a voltage supply for a memory system with temperature sensitive voltage adaptive circuitry according to embodiments. Referring to FIG. 3, in a block 301, a memory device can receive a voltage supply having at least a retention voltage level that varies based on a temperature of an environment around the memory device. In a block 302, the memory device can utilize the voltage supply to retain stored data. The memory device can include one or more memory cells configured to store data. In some embodiments, the memory device can be a Static Random Access Memory (SRAM) device, Dynamic Random Access Memory (DRAM) device, or the like, which utilizes a voltage supply to perform memory access operations, such reading or writing data to the memory cells, and to retain stored data in the memory cells. The voltage supply can correspond to a difference between a memory supply voltage and a memory bias supply voltage. The retention voltage level can correspond to a voltage level capable of allowing the memory device to continue to store the data without corruption due to a lack of an adequate supply voltage. The retention voltage level for the memory device can vary based on an environmental temperature, for example, the retention voltage level can become lower when the temperature of the environment increases.

In a block 303, a temperature sensitive circuit can generate a bias voltage based on the temperature and voltage supply of the environment. In some embodiments, the temperature dependent circuit can reduce the memory supply voltage by a magnitude correlated to the temperature of the environment to generate the bias voltage. For example, when the environment corresponds to a colder temperature, the temperature dependent circuit can reduce the bias voltage towards zero. When the environment corresponds to a warmer temperature, the temperature dependent circuit can increase the bias voltage relative to the voltage level associated with the environment having the colder temperature.

In a block 304, the temperature sensitive circuit can set a voltage level of a feedback voltage based on the bias voltage. In a colder temperature environment, the bias voltage can have a low voltage level, for example, near zero voltage. The temperature sensitive circuit can set the feedback voltage to a high voltage level in response to the bias voltage. In a hot temperature environment, the bias voltage can have a high voltage level relative to the bias voltage generated in a colder temperature environment. The temperature sensitive circuit can set to the feedback voltage to a voltage level correlated to the memory bias supply voltage in response to the bias voltage. In some embodiments, the high voltage level of the bias voltage can effectively short circuit a portion of the temperature sensitive circuit, resulting in the feedback voltage and the memory bias supply voltage having a similar voltage level.

In a block 305, the temperature sensitive circuit can alter the memory bias supply voltage based on the feedback voltage, which adjusts the voltage supply towards the retention voltage level. Since the voltage level of the voltage supply can correlate to a magnitude of a leakage current exiting the memory device, which corresponds to power consumption by the memory device, the temperature sensitive circuit can reduce the voltage supply to the memory device towards the retention voltage level.

The temperature sensitive circuit can reduce the memory bias supply voltage in response to the feedback voltage, which can increase the voltage supply to a memory device. When the temperature sensitive circuit sets the feedback voltage to the memory bias supply voltage, for example, in a hot temperature environment, the increase of current from the memory can be used to reset the feedback voltage, and the temperature sensitive circuit can reduce the memory bias supply voltage based on the reset feedback voltage. This iterative reduction of the memory bias supply voltage through the feedback process can continue until a steady state for the memory bias supply voltage has been reached.

Example Temperature Sensitive Circuitry Operation in Different Environments

Figure 4A:
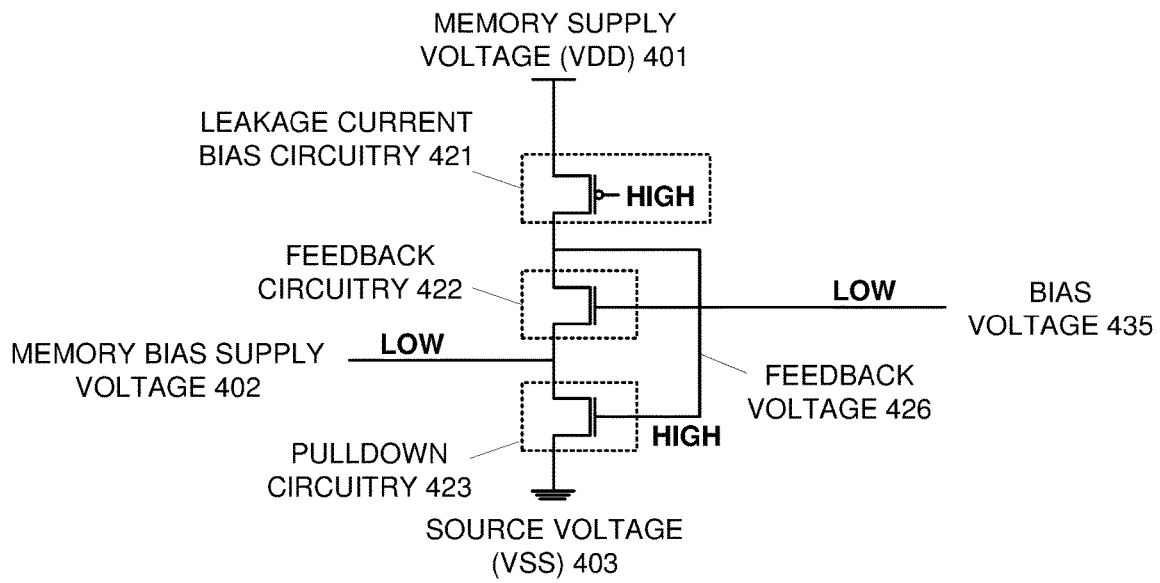
FIGS. 4A and 4B illustrate example operation of temperature sensitive circuitry in different environments according to embodiments.

FIG. 4A illustrates an example operation of temperature sensitive voltage adaptive circuitry 400 in a cold environment according to embodiments. Referring to FIG. 4A, the temperature sensitive voltage adaptive circuitry 400 can include leakage current bias circuitry 421, feedback circuitry 422, and pulldown circuitry 423 that can be configured similarly to the leakage current bias circuitry 221, the feedback circuitry 222, and the pulldown circuitry 223 described above with reference to FIGS. 2A and 2B. The leakage current bias circuitry 421, the feedback circuitry 422, and the pulldown circuitry 423 can work in combination to adjust the memory bias supply voltage 402 based on a voltage level of the bias voltage 435.

In a colder temperature environment, the bias voltage 435 can have a low voltage level, for example, near zero voltage. The feedback circuitry 422 can set the feedback voltage 426 to a high voltage level in response to the bias voltage 435. The feedback circuitry 422, in response to the bias voltage 435, can set the feedback voltage 426 to the high voltage level generated by the leakage current bias circuitry 421. The pulldown circuitry 423 can adjust the memory bias supply voltage 402 based on the high voltage level of the feedback voltage 426. For example, the pulldown circuitry 423 can reduce the memory bias supply voltage 402 in response to the feedback voltage 426, which can increase the voltage supply to a memory device.

Figure 4B:
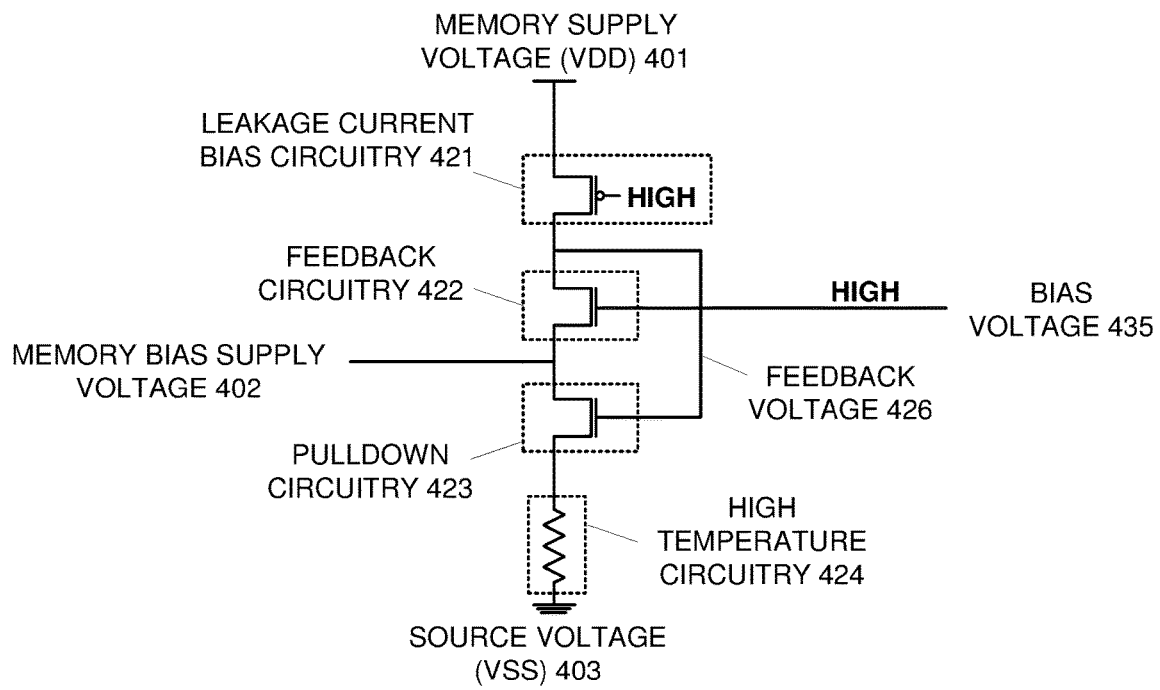

FIG. 4B illustrates an example operation of temperature sensitive voltage adaptive circuitry 410 in a hot environment according to embodiments. Referring to FIG. 4B, the temperature sensitive voltage adaptive circuitry 410 can include leakage current bias circuitry 421, feedback circuitry 422, pulldown circuitry 423, and high temperature circuitry 424 that can be configured similarly to the leakage current bias circuitry 221, the feedback circuitry 222, the pulldown circuitry 223, and the high temperature circuitry 224 described above with reference to FIGS. 2A and 2B. The leakage current bias circuitry 421, the feedback circuitry 422, the pulldown circuitry 423, and the high temperature circuitry 424 can work in combination to adjust the memory bias supply voltage 402 based on a voltage level of the bias voltage 435.

In a hot temperature environment, the bias voltage 435 can have a high voltage level, for example, large enough to activate an NMOS transistor in the feedback circuitry 422. The feedback circuitry 422 can set to the feedback voltage 426 to a voltage level correlated to the memory bias supply voltage 402. In some embodiments, the high voltage level of the bias voltage 435 can effectively short circuit the feedback circuitry 422 resulting in the feedback voltage 426 and the memory bias supply voltage 402 having a similar voltage level. The high temperature circuitry 424 can raise a voltage level of the memory bias supply voltage 402 and the feedback voltage 426 based on a total current.

The pulldown circuitry 423 can adjust the memory bias supply voltage 402 based on the feedback voltage 426. For example, the feedback circuitry 422 can reduce the feedback voltage 426 in response to the bias voltage 435. The new voltage level for feedback voltage 426 can alter the operation of the pulldown circuitry 423, for example, increase the memory bias supply voltage 402 by a smaller magnitude. This increase of the memory bias supply voltage 402 by the pulldown circuitry 423 and corresponding feedback process can continue until a steady state has been reached. The voltage level of the memory bias supply voltage 402 in a hot temperature environment can be set at a higher level than in a colder environment, which can allow the voltage supply of the memory device to be reduced.

CONCLUSION

While the application describes specific examples of carrying out embodiments, those skilled in the art will appreciate that there are numerous variations and permutations of the above described systems and techniques that fall within the spirit and scope of the invention as set forth in the appended claims.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A system comprising:
a memory device configured to retain stored data when receiving a voltage supply having at least a retention voltage level that varies based on a memory supply voltage and a temperature of an environment around the memory device; and
a sensitive circuit configured to adjust the voltage supply received by the memory device based on the memory supply voltage and the temperature of the environment.

2. The system of claim 1, wherein the voltage supply corresponds to a difference between the memory supply voltage and a memory bias supply voltage associated with the memory device, and wherein the sensitive circuit is configured to alter the memory bias supply voltage to adjust a voltage level of the voltage supply towards the retention voltage level.

3. The system of claim 2, wherein the sensitive circuit further comprising:
a temperature dependent circuit configured to generate a bias voltage based, at least in part, on the temperature of the environment; and
an adjustment circuit configured to alter the memory bias supply voltage based on the bias voltage.

4. The system of claim 3, wherein the adjustment circuit further comprises:
pulldown circuitry to alter the memory bias supply voltage based, at least in part, on a feedback voltage; and
feedback circuitry configured to set a voltage level of the feedback voltage based, at least in part, on the bias voltage from the temperature dependent circuit.

5. The system of claim 4, wherein the adjustment circuit further comprises leakage current bias circuitry configured to generate a leakage current bias voltage based on the memory supply voltage, wherein the feedback circuitry is configured to set the feedback voltage to leakage current bias voltage based on the bias voltage from the temperature dependent circuit.

6. The system of claim 4, wherein the feedback circuitry is configured to set the feedback voltage to a voltage level corresponding to the memory bias supply voltage based on the bias voltage from the temperature dependent circuit.

7. The system of claim 4, wherein the adjustment circuit further comprises high temperature circuitry coupled to the pulldown circuitry, wherein the high temperature circuitry is configured to increase the memory bias supply voltage based on a leakage current from the memory device.

8. A method comprising:
receiving, by a memory device, a voltage supply having at least a retention voltage level that varies based on a memory supply voltage and a temperature of an environment around the memory device
utilizing, by the memory device, the voltage supply to retain stored data; and
adjusting the voltage supply received by the memory device based on the memory supply voltage and the temperature of the environment.

9. The method of claim 8, wherein the voltage supply corresponds to a difference between the memory supply voltage and a memory bias supply voltage associated with the memory device, and further comprising altering the memory bias supply voltage to adjust a voltage level of the voltage supply towards the retention voltage level.

10. The method of claim 9, wherein altering the memory bias supply voltage to adjust the voltage level of the voltage supply further comprises reducing the memory bias supply voltage based on a leakage current from the memory device and the temperature of the environment.

11. The method of claim 9, further comprising generating a bias voltage based, at least in part, on the temperature of the environment, wherein altering the memory bias supply voltage to adjust the voltage level of the voltage supply is performed based on the bias voltage.

12. The method of claim 11, wherein altering the memory bias supply voltage to adjust the voltage level of the voltage supply further comprises:
   setting a voltage level of a feedback voltage based, at least in part, on the bias voltage; and
   altering the memory bias supply voltage based, at least in part, on the feedback voltage.

13. The method of claim 12, wherein altering the memory bias supply voltage to adjust the voltage level of the voltage supply further comprises:
   generating a leakage current bias voltage based on the memory supply voltage; and
   setting the feedback voltage to leakage current bias voltage based on the bias voltage.

14. The method of claim 12, wherein altering the memory bias supply voltage to adjust the voltage level of the voltage supply further comprises setting the voltage level of the feedback voltage to correspond to the memory bias supply voltage based on the bias voltage.

15. A device comprising:
   a temperature dependent circuit configured to generate a bias voltage based, at least in part, on a supply voltage and an environmental temperature; and
   an adjustment circuit configured to alter a voltage supply for an electronic device based on the bias voltage, wherein the adjustment circuit includes pulldown circuitry to alter a bias supply voltage associated with the voltage supply for the electronic device based, at least in part, on a feedback voltage, and feedback circuitry configured to set a voltage level of the feedback voltage based, at least in part, on the bias voltage from the temperature dependent circuit.

16. The device of claim 15, wherein the voltage supply corresponds to a difference between the supply voltage provided to the electronic device and the bias supply voltage associated with the electronic device, and wherein the adjustment circuit is configured to alter the bias supply voltage to adjust the voltage supply.

17. The device of claim 15, wherein the adjustment circuit further comprises leakage current bias circuitry configured to generate a leakage current bias voltage based on the supply voltage, wherein the feedback circuitry is configured to set the feedback voltage to the leakage current bias voltage based on the bias voltage from the temperature dependent circuit.

18. The device of claim 15, wherein the feedback circuitry is configured to set the feedback voltage to a voltage level corresponding to the bias supply voltage based on the bias voltage from the temperature dependent circuit.

19. The device of claim 15, wherein the adjustment circuit further comprises high temperature circuitry coupled to the pulldown circuitry, wherein the high temperature circuitry is configured to reduce the bias supply voltage based on a leakage current from the memory device.

* * * * *